United States Patent [19]

Sabotke et al.

[11] Patent Number: 5,737,834
[45] Date of Patent: Apr. 14, 1998

[54] PROCESS AND APPARATUS FOR AUTOMATICALLY ASSEMBLING THE TOPS AND BOTTOMS OF CIRCUITBOARDS WITH SMDS

[75] Inventors: Jens Sabotke, Hildesheim; Ansgar Graen, Diekholzen; Hans-Walter Heinrich, Hildesheim, all of Germany

[73] Assignee: Blaupunkt-Werke GmbH, Hildesheim, Germany

[21] Appl. No.: 637,758

[22] PCT Filed: Aug. 24, 1995

[86] PCT No.: PCT/DE95/01121

§ 371 Date: May 3, 1996

§ 102(e) Date: May 3, 1996

[87] PCT Pub. No.: WO96/09749

PCT Pub. Date: Mar. 28, 1996

[30] Foreign Application Priority Data

Sep. 20, 1994 [DE] Germany ............... 44 33 378.1

[51] Int. Cl.[6] ............... H05K 3/34; B23P 19/00
[52] U.S. Cl. ............... 29/840; 29/740
[58] Field of Search ............... 29/840, 740, 832, 29/830; 228/180.21, 180.22

[56] References Cited

U.S. PATENT DOCUMENTS

| | | | |
|---|---|---|---|
| 3,859,723 | 1/1975 | Hamer et al. | 29/840 |
| 4,476,626 | 10/1984 | Gumbert et al. | 29/840 X |
| 4,506,443 | 3/1985 | Itoh | 29/840 |
| 4,761,881 | 8/1988 | Bora et al. | 29/840 |
| 4,916,805 | 4/1990 | Ellrich et al. | 29/840 X |
| 4,941,255 | 7/1990 | Bull | 29/840 X |
| 4,998,342 | 3/1991 | Bonnell et al. | 29/840 |
| 5,155,904 | 10/1992 | Majd | 29/840 X |
| 5,297,333 | 3/1994 | Kusaka | 29/840 |

FOREIGN PATENT DOCUMENTS

| | | | |
|---|---|---|---|
| 3806984A1 | 9/1989 | Germany. | |
| 3805487C2 | 12/1989 | Germany. | |
| 3-12993 A | 1/1991 | Japan | 29/840 |
| 4-167496 A | 6/1992 | Japan | 29/840 |
| 5-259631 A | 8/1993 | Japan | 29/840 |

*Primary Examiner*—Horace M. Culver
*Attorney, Agent, or Firm*—Kenyon & Kenyon

[57] ABSTRACT

A process and a means for automatic assembly of the top and bottom sides of circuitboards with SMDs is described. The SMD assembly machine in this means has two parallel pickup stations for conveyor belts for the circuitboards for this purpose.

7 Claims, 3 Drawing Sheets

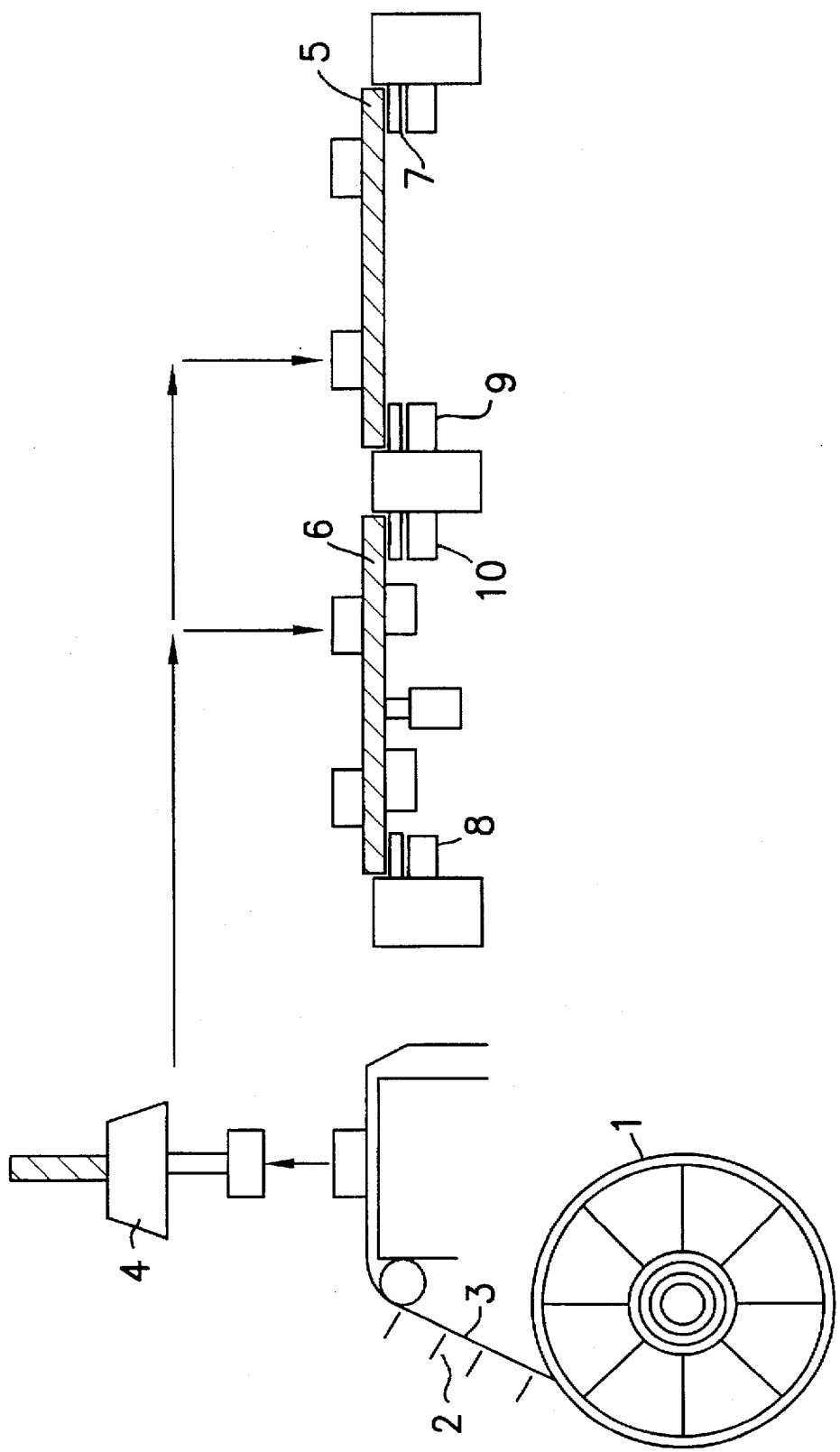

PROCESS AND APPARATUS FOR AUTOMATICALLY ASSEMBLING THE TOPS AND BOTTOMS OF CIRCUITBOARDS WITH SMDS

BACKGROUND INFORMATION

The present invention concerns a process for automatically assembling the top and bottom sides of circuitboards with SMDs and a means for carrying out this process.

As a rule, circuitboards to be assembled have a network of conductors on the bottom side, connecting the terminals of the components according to their functions. These circuitboards are conveyed through the individual processing stations by a conveyor belt and pass by means for assembling the circuitboards from overhead, so-called automatic surface mounting means or SMD assemblers that bring the components to predetermined locations on the top side of the circuitboard. For this purpose, the automatic component assemblers have gripper elements that can be guided in a horizontal plane to any point on the surface of the circuitboard. The components themselves are previously placed on a carrier that in many cases is rolled up into a roll. The components are removed from this carrier in series—for example, by an assembly suction nipple—and brought to the intended position.

After depositing all the SMDs required for the circuits on the circuitboard, the components are soldered at their terminals in a soldering station, and then the circuit is tested for proper operation.

As a result of the desire to minimize the space required by these circuits, SMDs are also arranged on the bottom of the circuitboard. After the soldering station, the circuitboard is lifted off the conveyor belt and turned over, so the bottom of the circuitboard faces up and is provided with an adhesive at the places for SMDs there. Then the circuitboard passes through a second automatic surface mounting means or SMD assembler, where additional SMDs are assembled on the bottom of the circuitboard, which is then facing upward.

After the second automatic SMD assembler, the adhesive is cured in a curing station so the components adhere well to the circuitboard. Then the circuitboard is turned over again and next it passes through a wave soldering station to solder the components to the conductors on the bottom of the circuitboard.

Components that cannot be manipulated with an assembly suction nipple may optionally be positioned manually in advance on the top of the circuitboard.

The present invention is based on the object of reducing this effort if possible.

It is general knowledge that several circuitboards can be applied on a single assembly panel, forming so-called multiple circuitboards. However, after solder paste has been applied to such multiple circuitboards and the circuitboards have been assembled and soldered, they must be separated. Methods of separating such a multiple circuitboard assembly panel into individual circuitboards are disclosed, for example, in German patent application No. 38 06 984 A1 and in German Patent No. 38 05 487 C2. It is also known from the state of the art described in German patent application P 43 42 885 of Dec. 16, 1993 that circuitboards can be supplied in a panel, where the consumers expect almost 100% good panels. For this purpose it is proposed in the latter patent application that the individual circuitboards be provided with a parting line in the component panel before they are assembled, so that circuitboards which have been identified as defective can be detached from the panel. The shape of the parting line is such that, for example, left-over intact circuitboards from one panel can be inserted into another panel and will fit there perfectly.

SUMMARY OF THE INVENTION

In the process and apparatus according to the present invention, the top of a circuitboard to which solder paste has been applied at predetermined locations and the bottom of a previously turned circuitboard to which adhesive has been applied at predetermined locations are conveyed side by side and at the same speed through the same SMD assembler and thus form one assembly panel. An apparatus for successive double reversal of the direction of conveyance of the circuitboards is also described herein.

BRIEF DESCRIPTION OF THE DRAWINGS

FIG. 3 illustrates a cross section of an apparatus according to an embodiment of the present invention.

DETAILED DESCRIPTION OF THE INVENTION

The process according to an embodiment of the present invention begins when the blank circuitboard is removed from a storage container and placed on a conveyor belt with the top side facing up. Then in the solder paste applying station, solder paste is applied to the solder points for the SMDs to be inserted on this side of the blank circuitboard and to the contact boreholes for connecting conductors on the top of the circuitboard to conductors on the bottom in a known way. Then the circuitboard passes through an SMD assembly machine on the conveyor belt that is guided by the first of two pickup stations for conveyor belts in the SMD assembly means. FIG. 3 shows a cross section through this SMD assembly means, which is explained in detail below.

The outlet of the first pickup station in the SMD assembly machine is followed by a reflow soldering station where the circuitboards are heated by infrared heaters so the solder in the paste melts and the other components of the paste evaporate. Then the direction of conveyance of the circuitboards is rotated by 180° and the circuitboard is returned to the entrance of the machine.

Before the entrance of the second pickup station for a conveyor belt in the SMD assembly machine, the direction of conveyance of the circuitboard is again rotated by 180° and the circuitboards then pass first through a circuitboard turner that turns the circuitboards in a known way so the bottom faces up, and an adhesive station where spots of adhesive are applied between the component terminal solder points at the locations of the SMDs. Then the conveyor belt runs into the second pickup station in the SMD assembly machine and then is guided in the same cycle next to the conveyor belt in the first pickup station, where the circuitboards conveyed on the two belts are aligned with respect to each other so they form a single assembly panel for the SMD assembly machine.

In the SMD assembly machine, the assembly suction nipple is guided to the locations for SMDs on the two surfaces of the circuitboards side by side, and SMDs are positioned on both surfaces, namely the top side of a newly inserted blank circuitboard and the bottom of a circuitboard that has already been assembled on the top side and then turned over. The components adhere to the top side of the new blank circuitboard in the solder paste until the subsequent reflow soldering, but they are held on the bottom of the circuitboard with adhesive.

Then a curing station for the adhesive is located downstream from the outlet of the second pickup station in the SMD assembly machine. Next the circuitboard is turned over again and finally the SMDs are soldered at the terminals on the bottom of the circuitboard in a wave soldering bath.

Figure 1:
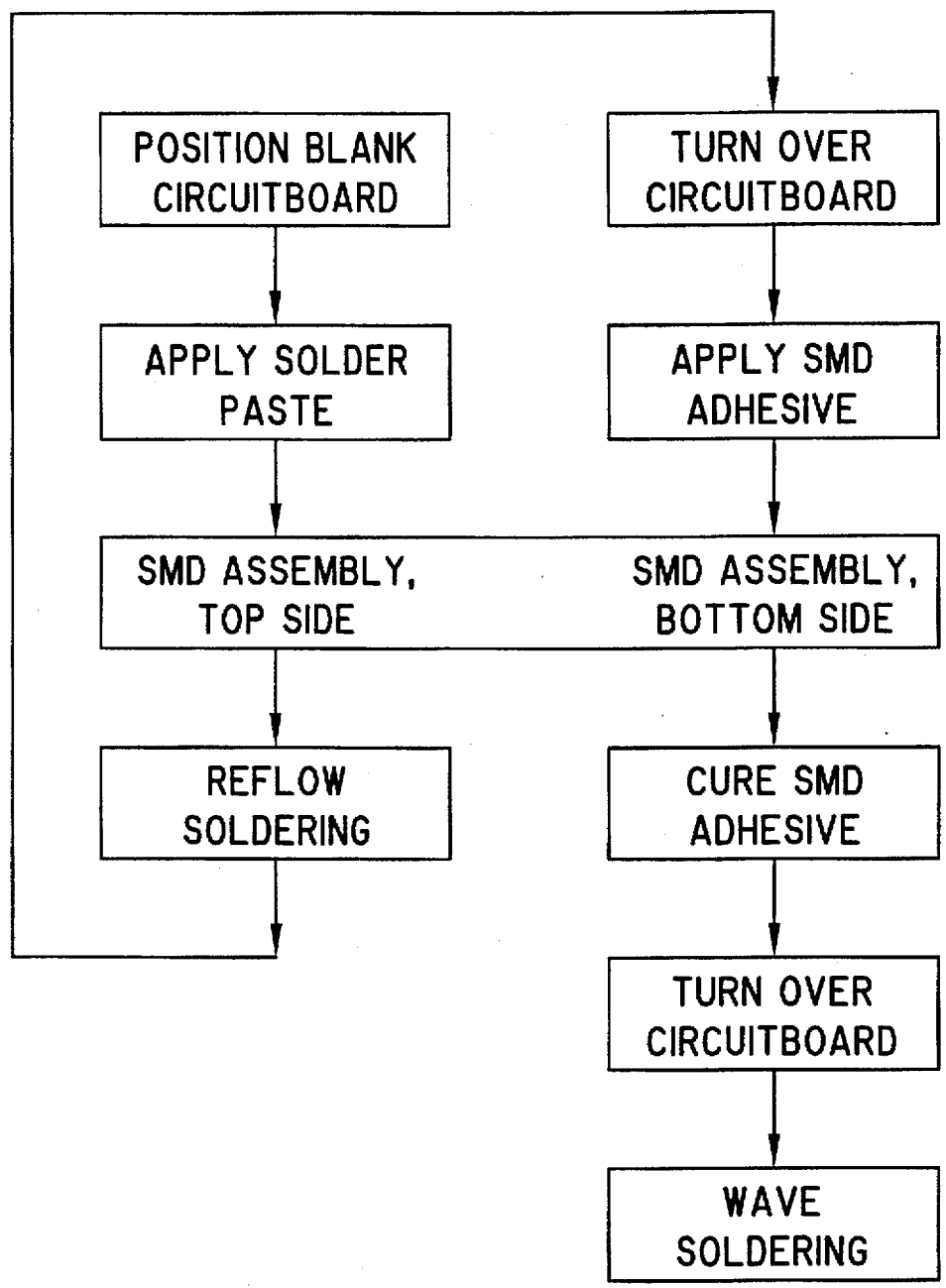
FIG. 1 illustrates a general flow chart according to the present invention.
Figure 2:
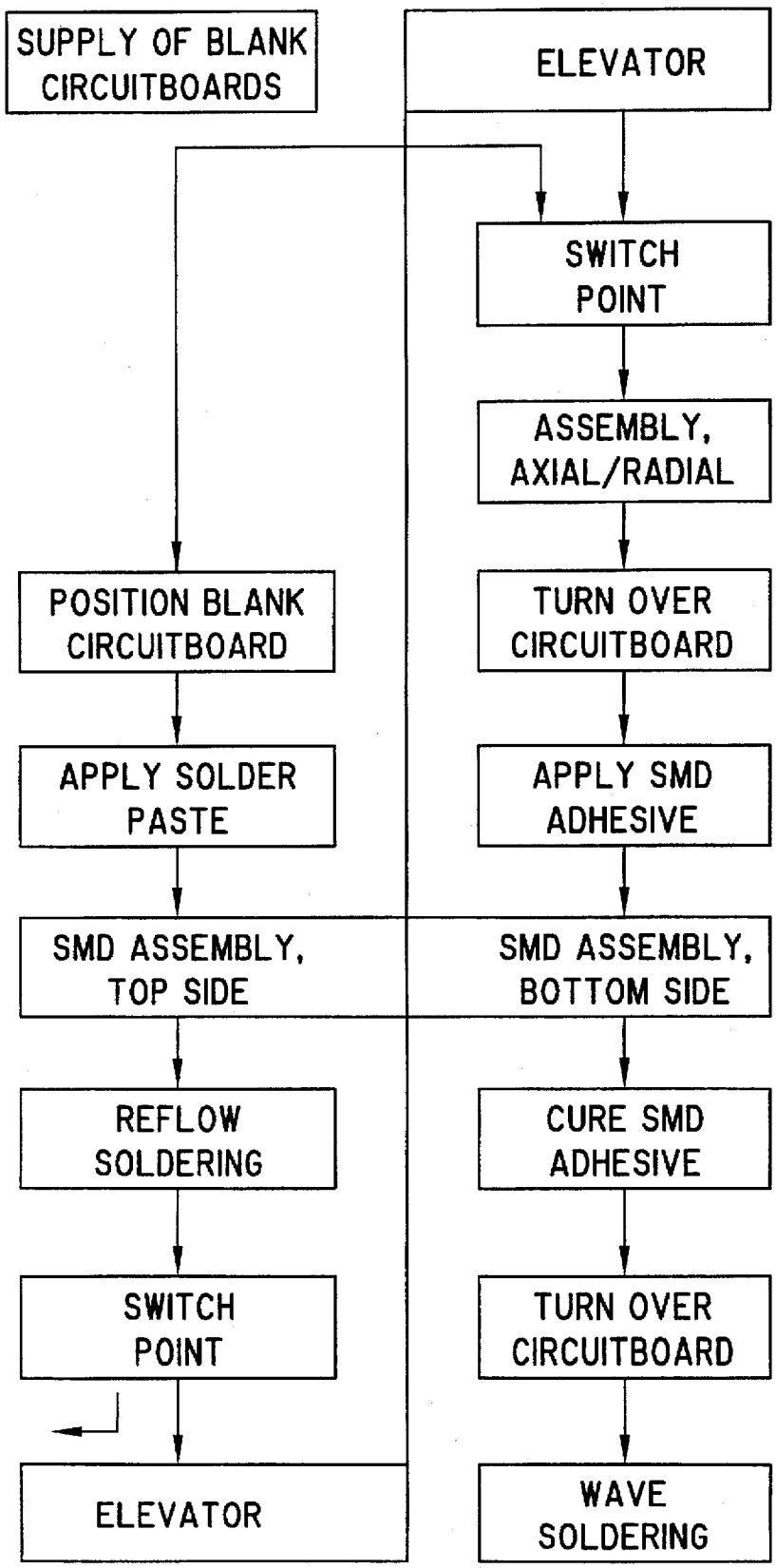
FIG. 2 illustrates another embodiment of the present invention.

If necessary, testing stations and, as indicated in FIG. 2, assembly sites for components with radial or axial terminals or for shields or housing parts that are to be soldered to the conducting surfaces on the circuitboard may be integrated into the process described so far.

The reversing stations for the direction of travel of the circuitboards can also be integrated into the process upstream from the reflow station, for example, if accommodations require, so they are arranged in the return path of the circuitboard.

The turning station can also be integrated directly downstream from the outlet of the reflow station and only then is the direction of conveyance reversed again.

It is important for the two extensive surfaces of the circuitboard to be brought together to form one panel during the assembly process in the SMD assembly machine despite the fact that different adhesives have been applied to them for mounting the SMDs.

With the expanded flow chart illustrated in FIG. 2, a switch point is provided after the reflow soldering station where circuitboards that are to have SMDs assembled only on the top side can be discharged from the additional process according to this invention. The circuitboards remaining in the process are then lifted up from the conveyor belt in an elevator and returned via a second conveyor belt running in the opposite direction to a second elevator where the circuitboards are placed on a third conveyor belt that runs forward again. This elevator is followed by a second switch point where the blank circuitboards whose tops are not to be assembled can be taken from the storage container and introduced into the remainder of the process.

Downstream from this second switch point there is a station for assembling the top of the circuitboard with radial or axial components. These components have wire terminals pointing either radially or axially. After this assembly stage, the circuitboards are turned over, as described above, and then the adhesive is applied and the circuitboard is conveyed through the SMD assembly machine on the conveyor belt guided by the second pickup station. Then the adhesive is cured, the circuitboard is turned over again and the SMDs held on the bottom of the board with an adhesive are soldered.

The cross section through an SMD assembly machine according to the present invention is illustrated in the diagram in FIG. 3, showing on the left side an SMD component supply roll 1 from which the SMDs 2 can be unrolled with their carrier belt 3. The carrier is then passed under an assembly suction nipple 4 that lifts the SMDs up from the carrier in a known way. Assembly suction nipple 4 then travels to the right with the SMD component over the surface of two circuitboards 5 and 6 that lie side by side on the respective conveyor belts 7 and 8 and form a single assembly panel for the SMD suction nipple. The conveyor belts are in turn guided in two pickup stations 9 and 10 arranged side by side.

In accordance with the commands in the control program of the assembly suction nipple, SMDs 2 are then placed in their respective positions on the surfaces of the circuitboards to which different adhesives have been applied and which form an assembly panel at this point. The "top" of the left circuitboard which is at the bottom has already been fitted with SMDs 2 and with additional components 11 with axial terminal wires.

We claim:

1. A process for automatically assembling a plurality of circuit boards using SMDs, each one of the plurality of circuit boards having an associated top side and an associated bottom side, the plurality of circuit boards including first and second circuit boards, the process comprising the steps of:

applying a solder paste to at least a first preselected portion of the top side of the first circuit board;

turning over the second circuit board to expose the bottom side of the second circuit board;

providing at least a second portion of the bottom side of the second circuit board with adhesive spots; and conveying at least the first and second circuit boards of the plurality of circuit boards in a substantially parallel manner, the first and second circuit boards conveyed at a substantially same velocity, the first and second circuit boards conveyed through a SMD assembly apparatus for forming an assembly panel.

2. The process as recited in claim 1, wherein the SMD assembly apparatus includes a first and a second pickup station, the first and second pickup stations positioned substantially parallel to one another.

3. The process as recited in claim 2, wherein the SMD assembly apparatus is coupled to a conveyor for conveying the plurality of circuit boards.

4. An apparatus for automatically assembling a plurality of circuit boards using SMDs, each circuit board having an associated top side and an associated bottom side, the apparatus comprising:

at least one device for applying a solder paste to the top side of the associated circuit board on at least one predetermined position;

a SMD assembly machine including a first and a second pickup station, the first and second pickup stations positioned substantially parallel in relation to each other, the SMD assembly machine having transporting means for conveying the plurality of circuit boards, the SMD assembly machine assembling the top side of the associated circuit board with SMDs;

means for reflow-soldering of the assembled top side of the each circuit board downstream from the first pickup station of the SMD assembly machine;

first and second means for reversing a direction for transporting each circuit board, the direction being reversed at least twice in succession;

first means for turning the circuit board to expose the bottom side of the associated circuit board;

means for applying adhesive at predetermined positions, the means for applying adhesive arranged upstream from the second pickup station of the SMD assembly machine;

means for curing the adhesive arranged downstream from the second pickup station, the means for curing arranged substantially near the means for applying adhesive;

second means for turning the circuit board to expose the bottom side of the associated circuit board; and means for soldering the SMDs to conductors applied on the bottom side of the associated circuit board.

5. The apparatus as recited in claim 4, wherein the SMD assembly machine includes first and second conveyor means, the first conveyor means guided by the first pickup station, the second conveyor means guided by the second pickup station.

6. The apparatus as recited in claim 5, wherein the first and second means for reversing the direction of transporting each circuit board each include a first elevator for lifting the circuit board up from the first conveyor means, a second elevator for setting the circuit board down on the second conveyor means, and a third conveyor means to connect the first and second elevators.

7. The apparatus as recited in claim 6, wherein a direction of travel of the third conveyor means is opposite to a direction of travel of the transporting means of the SMD assembly machine.

* * * * *